(12) United States Patent
Gao

(10) Patent No.: US 11,849,564 B2
(45) Date of Patent: Dec. 19, 2023

(54) SERVER RACK COMPONENT FOR ADVANCED FLUID ARRANGEMENT

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 360 days.

(21) Appl. No.: 17/354,367

(22) Filed: Jun. 22, 2021

(65) Prior Publication Data

US 2022/0408594 A1 Dec. 22, 2022

(51) Int. Cl.
*H05K 7/20* (2006.01)
*H01F 7/06* (2006.01)

(52) U.S. Cl.
CPC ......... *H05K 7/20272* (2013.01); *H01F 7/064* (2013.01); *H05K 7/20818* (2013.01)

(58) Field of Classification Search
CPC .......... H05K 7/20272; H05K 7/20327; H05K 7/20818; H01F 7/064
See application file for complete search history.

(56) References Cited

U.S. PATENT DOCUMENTS

| 11,419,243 | B2* | 8/2022 | Chen | H05K 7/20772 |
| 11,553,627 | B1* | 1/2023 | Gregory | H05K 7/20781 |
| 2017/0127575 | A1* | 5/2017 | Lunsman | H05K 7/20263 |
| 2017/0177041 | A1* | 6/2017 | Shelnutt | H05K 7/20809 |
| 2018/0131128 | A1* | 5/2018 | Franz | H01R 13/5219 |
| 2022/0151114 | A1* | 5/2022 | Heydari | H05K 7/20272 |

* cited by examiner

*Primary Examiner* — Jacob R Crum
(74) *Attorney, Agent, or Firm* — WOMBLE BOND DICKINSON (US) LLP

(57) ABSTRACT

An adopting core device including a main board, a server connector module, a leaking sensor, and an electromagnet device is proposed in the current application. In an embodiment, a main board including a fluid channel assembled by a manual mating connector through hoses and a blind mating connector fixed on the other side. In an embodiment, the manual mating connector is connected to a rack connector of a rack manifold of an electronic rack coupled to an external cooling fluid source to receive and to return cooling fluid from and to the external cooling fluid source. For example, the blind mating connector is capable of being engaged with or disengaged from a server fluid connector of a server chassis. In an embodiment, the server chassis comprises a leaking sensor configured to detect leakage of the cooling fluid within the server chassis.

20 Claims, 8 Drawing Sheets

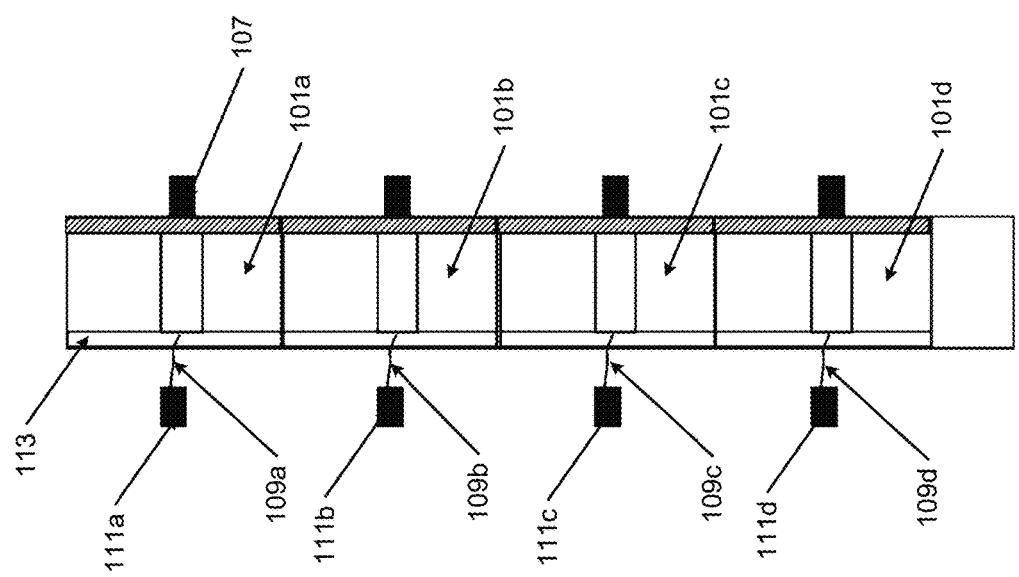

SERVER RACK COMPONENT FOR ADVANCED FLUID ARRANGEMENT

FIELD OF THE INVENTION

Embodiments of the present invention relate generally to the electronics cooling, cooling hardware and package, liquid cooling etc. More particularly, embodiments of the invention relate to a server rack component for advanced fluid arrangement.

BACKGROUND

Cooling is a prominent factor in an electronics system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

It is important to keep high reliability in liquid cooling. Therefore, minimizing the amount of the fluid leaking which gets exposed to the electronics is important for deploying this technology in data centers on a large scale.

In addition, designing a solution which minimizes the impact of a leaked fluid in a leakage incident is also critical for the solutions to be deployed on a large scale.

While conventional solutions may use fluid shutdown valves to cut the fluid circuit, this design introduces additional fluid parts, Other conventional solutions may use an individual pump for each loop, and the pump is shut down in a leakage incident. However, none of the existing solution qualify or are appropriate for server liquid cooling and electronics cooling.

BRIEF DESCRIPTION OF THE DRAWINGS

Embodiments of the invention are illustrated by way of example and not limitation in the figures of the accompanying drawings in which like references indicate similar elements.

FIG. 3 shows an adapting core assembled in a system according to an embodiment of the application.

DETAILED DESCRIPTION

Figure 1:
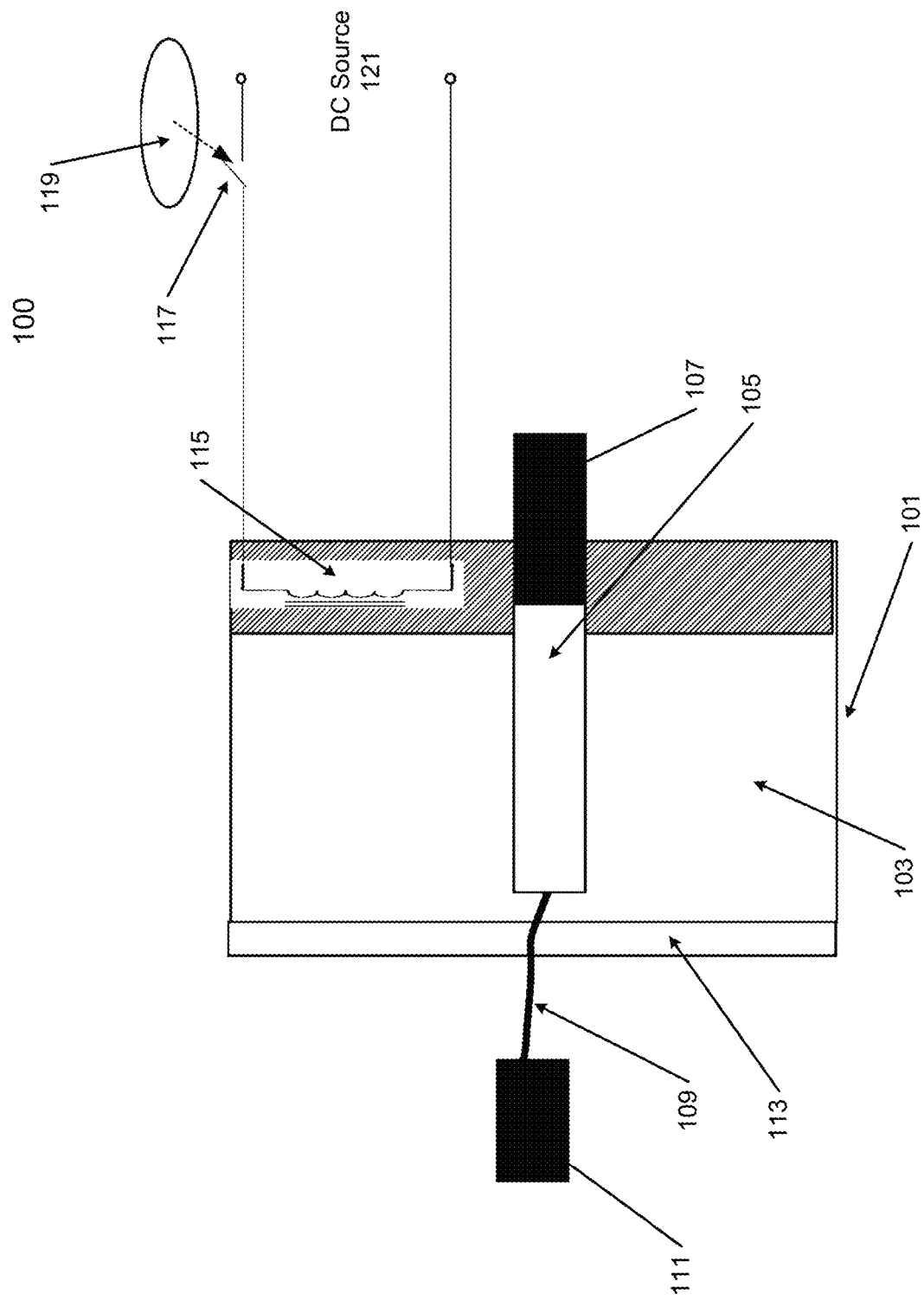
FIG. 1 shows an adapting core design according to an embodiment of the application.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The information technology (IT) hardware industry is a critical market for many reasons: it plays a crucial role in business competitiveness, service quality and availability, and also plays a significant role in the infrastructure total cost of ownership (TCO). IT hardware is closely linked with the profit of an organization. It is one of the core competencies of the internet giant, cloud computing service providers, as well as high performance computing and artificial intelligence (AI) computing related business service users and providers who build, operate, compute, store and manage other IT hardware platforms (e.g., servers) and infrastructures. The majority of the hyper-scale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, interoperable and cost effective solutions and architecture.

The disclosure aims to provide an advanced rack liquid cooling fluid management solution and leakage shutoff system used for both server and rack liquid system design and liquid server and leakage response systems. This system is especially significant when it comes to the leakage response system. In addition, the following items serve as additional challenges that the current work aims to solve: adaption of server and rack system design; integrating a leak feature to existing server and rack architecture that can shut off since adding an additional fluid shutdown valve cannot be realized on existing architecture; a quick system shutdown that is self-regulated in leakage scenarios; high reliability; ease of implementation and service; cost reduction; modular design for high compatibilities; and compatible with different use cases.

An advanced rack structure is proposed for fluid management and regulation in server and rack liquid cooling, according to an embodiment. For example, the main component proposed in the current work includes two-sided fluid connectors with one blind mating side, and one manual mating side. In an embodiment, the one for the rack manifold side is designed with manual mating connectors through flexible hoses. In some embodiments, the blind mating one is connected with server fluid connectors. In an embodiment, the adapting core includes a main board where the internal is a fluid channel built in inside the main body. For example, the fluid channel is assembled with both the blind mating connector and the manual mating connector. In an embodiment, the adapting body is designed with one side having an electromagnet and the other end with the spring structure. For example, the two units enable a change of displacement of the entire adapting body together with blind mating connector. In an embodiment, the electromagnet structure is connected to the DC source from the server board.

In an embodiment, an adopting core device includes a main board and an electromagnet device. For example, a main board includes a fluid channel assembled by a manual mating connector and a blind mating connector. In some embodiments, the manual mating connector is connected to a rack connector of a rack manifold of an electronic rack coupled to an external cooling fluid source to receive and to return cooling fluid from and to the external cooling fluid source. In an embodiment, the blind mating connector is capable of being engaged with or disengaged from a server fluid connector of a server chassis. In an embodiment, the server fluid connector is configured to supply cooling fluid to one or more cooling devices attached to one or more electronic devices contained within the server chassis for providing liquid cooling. In some embodiments, the server chassis comprises a leaking sensor configured to detect leakage of the cooling fluid within the server chassis.

In an embodiment, the electromagnet device includes an electromagnet and a controller coupled to the electromagnet. For example, in response to a leakage signal received from the leaking sensor indicating that a fluid leakage occurs, the controller may modify a magnetic field associated with the electromagnet, which causes the blind mating connector to disengage from the server fluid connector.

In an embodiment, a spring structure is attached to a rack side of the main board. In an embodiment, the manual mating connector is connected to the rack connector of a rack manifold of the electronic rack through a hose. In an embodiment, the server connector module having the server fluid connector is attached onto a rear side of the server chassis within the server chassis. In an embodiment, the electromagnet is connected to an electrical circuit coupled with a direct current (DC) voltage source. In an embodiment, the controller is coupled to a switch on the electrical circuit to provide power or cut off the power to the electromagnet in response to leakage signal received from the leaking sensor.

For example, in response to a leakage detection detected by a leakage sensor, the controller sends a signal to control the power provided to the electromagnet, i.e., reduce or cut off the power to the electromagnet. The reduced or cut off power may cause the electromagnet to reduce or lose the magnetic force that attracts the adopting core device towards to the server chassis. As a result, the adopting core device may be pushed away from the server chassis, which cause the blind mating connector of the adopting core device to disengage from the corresponding server fluid connector of the server chassis.

In an embodiment, the server connector module is attached onto a rear side of the server chassis within the server chassis. In an embodiment, when the server fluid connector is disengaged from the blind mating connector, the cooling fluid is prevented to flow from the rack manifold to the server chassis. In an embodiment, the adopting core device is pulled toward to the server chassis when the magnetic field associated with the electromagnet is modified to have magnetism, which causes the blind mating connector to engage from the server fluid connector.

In an embodiment, an electronic rack comprises a rack manifold and a plurality of adopting core devices arranged in a stack. For example, the rack manifold is coupled to an external cooling fluid source to receive and to return cooling fluid from and to the external cooling fluid source. In an embodiment, the rack manifold comprises a plurality of connectors. In an embodiment, each adopting core devices comprises a main board, and an electromagnet device.

In an embodiment, a server liquid cooling fluid cutoff system comprises a plurality of server chassis, a rack manifold and a plurality of adopting core devices. For example, a plurality of server chassis arranged in a stack. In an embodiment, the rack manifold is coupled to an external cooling fluid source to receive and to return cooling fluid from and to the external cooling fluid source. In an embodiment, the rack manifold comprises a plurality of connectors. In an embodiment, each adopting core devices comprises a main board, and an electromagnet device.

FIG. 1 shows an adapting core design 100 according to an embodiment of the application. In particular, FIG. 1 shows the solution design 100 proposed in the current disclosure, and it can be seen that the adapting core 101 is designed with a main body shown in area 105. Further, in an embodiment, the fluid channel (e.g., 105) is built in the main body 103. For example, the fluid channel is connected with connectors, with one end blind mating connector 107 and one end regular connector 111 through the hoses 109. In an embodiment, the two sides of the main body 103 are assembled and designed with a spring structure 113 and one electromagnet unit 115. In an embodiment, the function of the electromagnet unit 115 is to enable a force on the entire core unit 101 along the positive x direction, and this is to engage the connection of the blind mating connection 107 with the server side. In an embodiment, before the electromagnet unit 115 is connected to an active power source 121, no force is generated, therefore, the counter-direction force from the spring structure 113 disengage the blind mating connection 107 with the servers.

In an embodiment, the force generated from the electromagnet device 115 and the force generated from an elastic structure 113 (e.g., a spring) are in the opposite direction. For example, the elastic structure 113 (e.g., a spring) may pull the main body 103 along the negative x direction using the open space of the elastic structure 113 to disconnect the blind mating 107 and the server connector module (e.g., 125 in FIG. 2A or 2B); this disconnection occurs when the counterforce by the electromagnet device 115 becomes released, according to an embodiment.

In an embodiment, the electromagnet unit 115 is connected to the server DC power source 121, and the connection circuit is designed with a switch 117. The switch 117 is connected with, via a controller, the server leakage detection sensor 119 according to an embodiment. For example, the displacement of the adapting core 101 does not impact on the manual connector 111 since the flexible hoses 109 is used.

In an embodiment, a main board 103 including a fluid channel 105 assembled by a manual mating connector 111 and a blind mating connector 107. For example, the fluid channel 105 is connected, through the hoses 109, to a rack connector 111 of a rack manifold of an electronic rack coupled to an external cooling fluid source to receive and to return cooling fluid from and to the external cooling fluid source. In an embodiment, 111 is a manual connector. In an embodiment, 107 is a blind mating connector. In an embodiment, 111 is used to connect to the rack connector (now shown). In an embodiment, the blind mating connector 107 is a blind mating connector mated with the server blind mating connector. In an embodiment, the main body 103 is a holder. In an embodiment, 105 is a fluid channel hardware.

In an embodiment, the movement of the blind mating connector 107 is controlled by the electromagnet unit 115. In an embodiment, the fluid channel 105 and the blind mating connector 107 are fully fixed together.

Figure 2A:
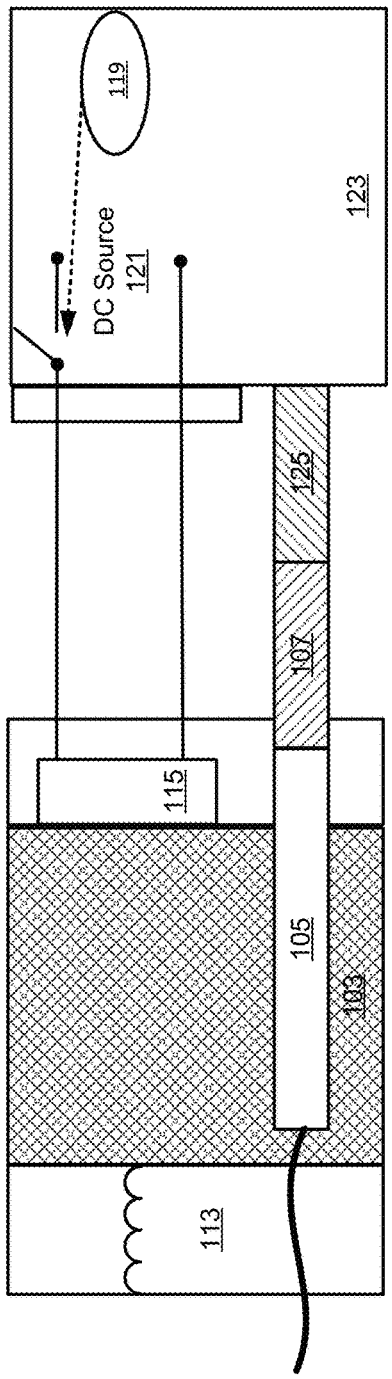
FIGS. 2A and 2B show an adapting core design with a server according to certain embodiments of the application.
Figure 2B:
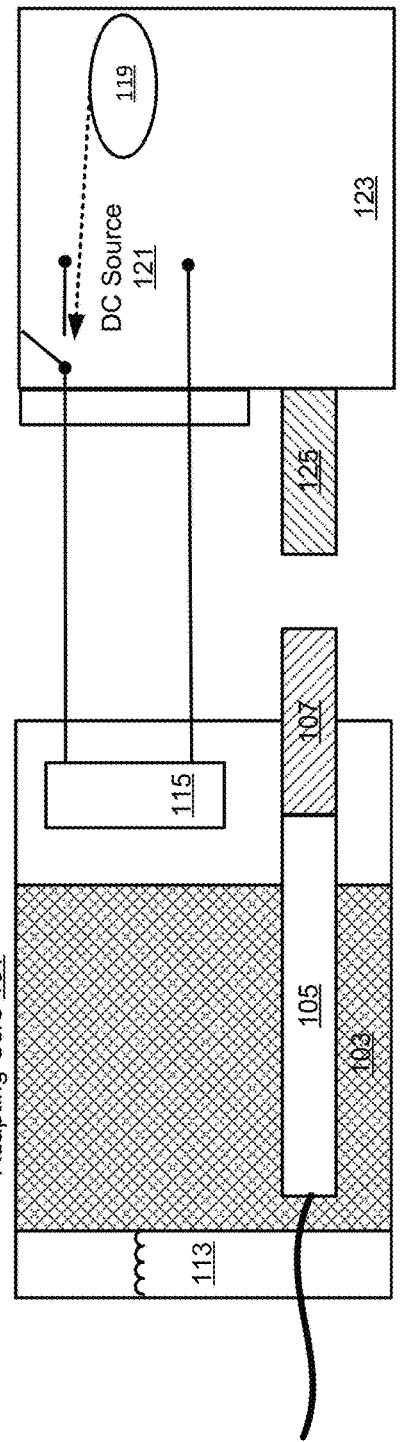

FIG. 2A-2B show an adapting core design 200 with a server 123 according to an embodiment of the application. FIG. 2A shows the connection of the adapting core 101 with a server chassis 123, and it can be seen that the connection includes fluid blind mating connector 107 and the power interface 127. For example, once the electromagnet 115 is connected to the DC source 121 from the server 123, it can enable a positive x direction displacement due to the magnetic force, then the blind mating connectors 107 are connected with server connector 125.

In an embodiment, as shown in FIG. 2A, when server chassis 123 is inserted from the frontend of an electronic rack, the rear end of server chassis 123 is engaged with adapting core 101. The adapting core 101 may be mounted fixedly on the electronic rack. In addition, electromagnetic device 115 is connected to DC source 121 via the power interface between the adapting core 101 and server chassis 123 (not shown). Once the power is supplied to electromagnetic device 115, the electromagnetic device 115 generate a magnetic force that attract the main body (or main board) 103 towards the electromagnetic device 115, in this example, from left to right. In one embodiment, fluid channel 105 and connector 107 are fixedly attached to main body 103, and they move altogether. In one embodiment, the main body 103 is contained within a container made of metal, such that main body 103 can be attracted towards the electromagnetic device 115 due to the magnetic force when being powered up.

In addition, spring structure (e.g., a spring) is attached between the rear end of adapting core 101 and the rear end of main body 103, where the spring can be compressed or stretched. When the electromagnetic device 115 is powered, the magnetic force draws main body 103 together with fluid channel 105 and connector 107 towards the electromagnetic device 115, such that connector 107 is connected with server connector 125. In this situation, spring is stretched as shown in FIG. 2A. When the electromagnetic device 115 is cut off from the DC source 121, the magnetic force disappears and the spring 113 is released back to its neutral state. The spring 113 pulls the main body (as well as fluid channel 105 and connector 107) away from the electromagnetic device 115, while the adapting core 101 and the electromagnetic device 115 remain steady, as shown in FIG. 2B. As a result, connector 107 is disconnected from server connector 125.

In an embodiment, the controller (not shown) is coupled to a switch 117 on the electrical circuit to provide power or cut off the power to the electromagnet 115 in response to leakage signal received from the leaking sensor 119.

In an embodiment, the server connector module 125 is attached onto a rear side or rear panel of the server chassis 123 outside of the server chassis. For example, when the server fluid connector 125 is disengaged from the blind mating connector 107 (e.g., FIG. 2B), the cooling fluid is prevented to flow from the rack manifold to the server chassis 123.

In an embodiment, the blind mating connector 107 is capable of being engaged (e.g., FIG. 2A) with or disengaged (e.g., FIG. 2B) from a server fluid connector 125 of a server chassis 123. In an embodiment, the server fluid connector 125 is a blind mating connector configured to supply cooling fluid to one or more cooling devices attached to one or more electronic devices contained within the server chassis 123 for providing liquid cooling. In an embodiment, the server chassis 123 comprises a leaking sensor 119 configured to detect leakage of the cooling fluid within the server chassis 123. Both connectors 125 and 107 are blind mating connectors.

In an embodiment, an electromagnet device 115 may be attached to a server side of the main board 103. For example, an electromagnet device 115 is coupled to a server connector module 125 and the leaking sensor 119. In an embodiment, in response to a leakage signal received from the leaking sensor 119 indicating that a fluid leakage occurs, a magnetic field associated with the electromagnet 115 is modified by a controller (now shown) coupled to the electromagnet 115, which causes the blind mating connector 107 to disengage from the server fluid connector 125 (e.g., FIG. 2B).

FIG. 3 shows an adapting core assembled in a system 300, according to an embodiment of the application. For example, FIG. 3 shows multiple adapting cores (e.g., 101a, 101b, 101c, 101d) assembled in a system, and it can be seen that the adapting core (e.g., 101a, 101b, 101c, 101d), is integrated together for a rack level component.

In an embodiment, the adapting cores locations (e.g., 101a) can be customized to accommodate different racks and servers. In an embodiment, a spring structure 113 is attached to a rack side of the main board. In an embodiment, the manual mating connector is connected to the rack connector (e.g., 111a, 111b, 111c, 111d) of a rack manifold of the electronic rack through a hose (e.g., 109a, 109b, 109c, 109d).

In an embodiment, the design 300 shown in FIG. 3 can be implemented to the liquid cooling rack, and the modular design can be used for configuring different solutions in different scenarios.

Figure 4:
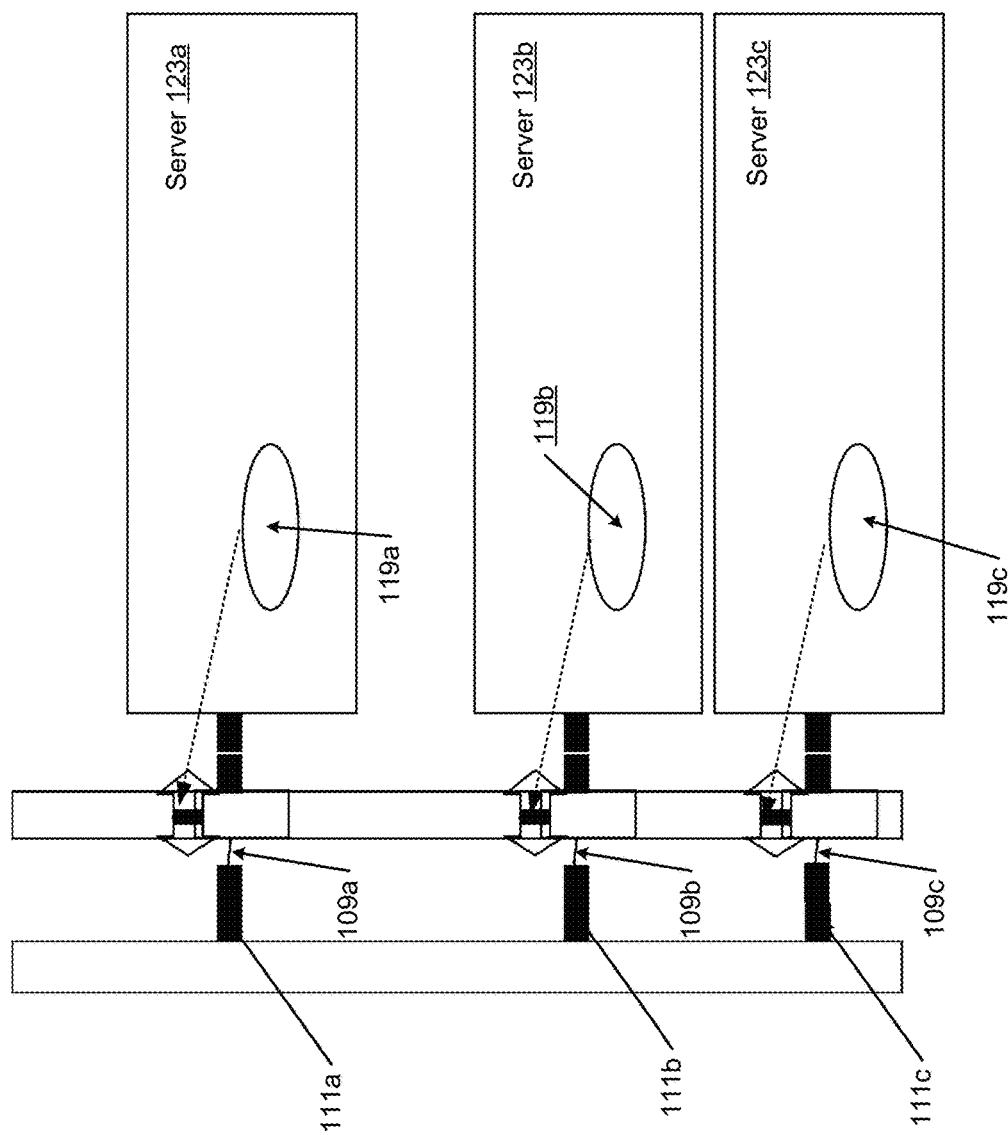
FIG. 4 shows an adapting core with fluid connection engaged for the server liquid cooling fluid cutoff system according to an embodiment of the application.

FIG. 4 shows an adapting core with fluid connection engaged for the server liquid cooling fluid cutoff system 400 according to an embodiment of the application. For example, FIG. 4 shows the rack level adapting system 400 used in a rack for multiple servers 123a, 123b, 123c. In an embodiment, rack connectors 111a, 111b, 111c are the manual mating ones and the connections of the two includes a section of flexible hoses 109a, 109b, 109c, and it can be seen that the exiting rack manifold does not support the fluid shutdown feature. In an embodiment, the rack adapting unit is the one shown in FIG. 3 that the rack level structure with multiple adapting cores 101a, 101b, 101c, 101d. For example, FIG. 4 shows all the blind mating ones 107a, 107b, 107c, 107d are connected and the leakage detection sensor (e.g., 119a, 119b, 119c) is used to for regulating the motion of the adapting core through the electromagnetic unit. In an embodiment, individual sensor (e.g., 119a, 119b, 119c) in each server (e.g., 123a, 123b, 123c) is used for controlling the DC power source for the adapting core.

Figure 5:
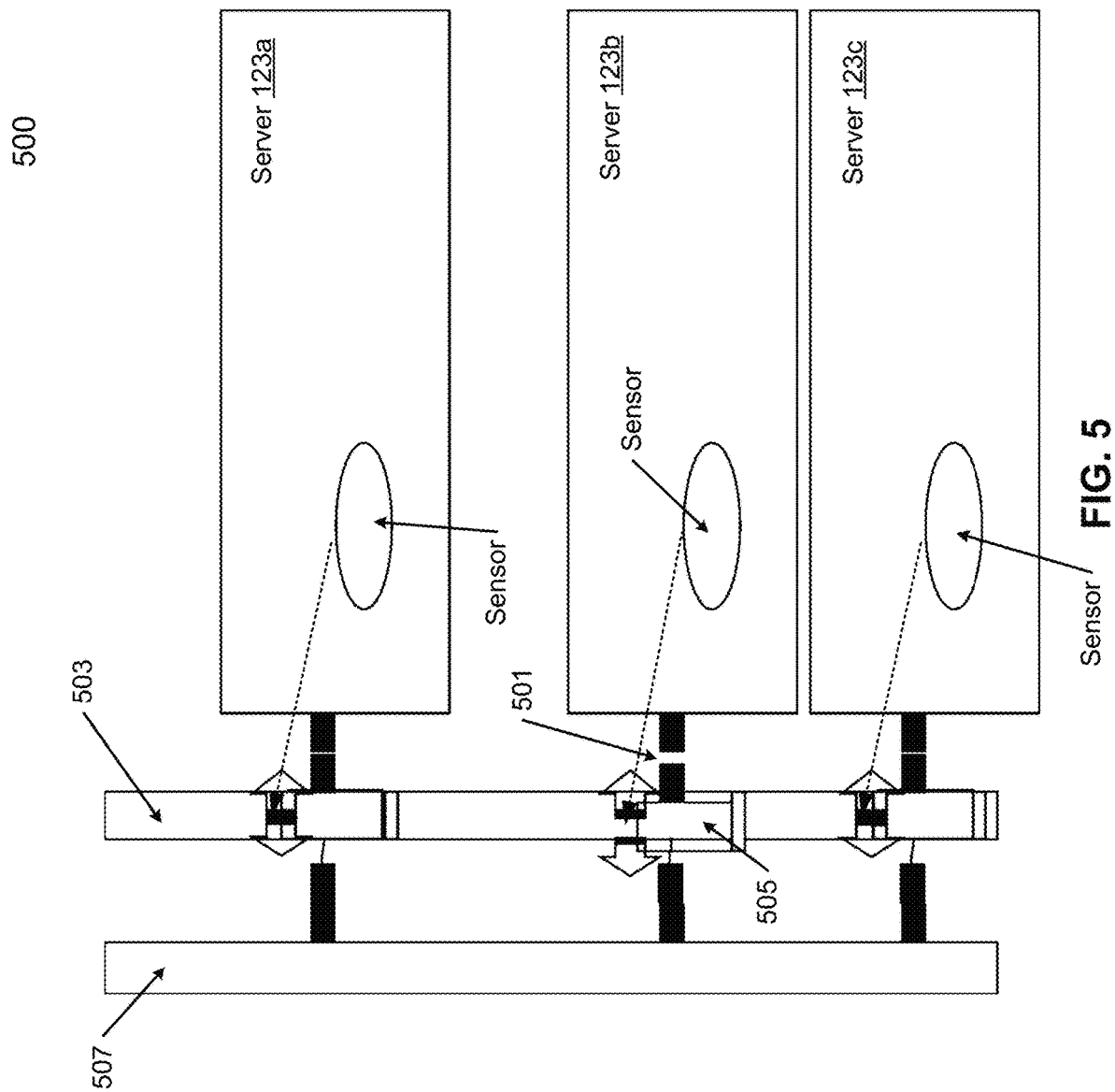
FIG. 5 shows an adapting core with fluid connection disengaged according to an embodiment of the application.

FIG. 5 shows an adapting core with fluid connection disengaged for the server liquid cooling fluid cutoff system 500, according to an embodiment of the application. For example, FIG. 5 shows that the server fluid is cutoff by the adapting core 505 on the rack adapting structure with the deactivation of the electromagnetic unit. In an embodiment, the spring force disconnects the blind mating 501 as shown in the figure. In addition, in the FIG. 5, it shows that the adapting structure 503 may include predesigned channels for assembling the modular adapting cores as illustrated in slash area.

In an embodiment, the adopting core device 505 is pushed away from the server chassis 123b when the magnetic field associated with the electromagnet is modified to loss magnetism, which causes the blind mating connector 501 to disengage from the server fluid connector. For example, when the adopting core device 505 is pushed away from the server chassis 123b, the server chassis 123b and the rack manifold 507 are remained without moving.

In an embodiment, the adopting core device 505 is pulled toward to the server chassis 123b when the magnetic field associated with the electromagnet is modified to have magnetism, which causes the blind mating connector to return back to the connection location. In an embodiment, the server can be removed since it needs to be serviced. For example, the reconnection of the two connectors may only happen when the server is installed again.

Figure 6:
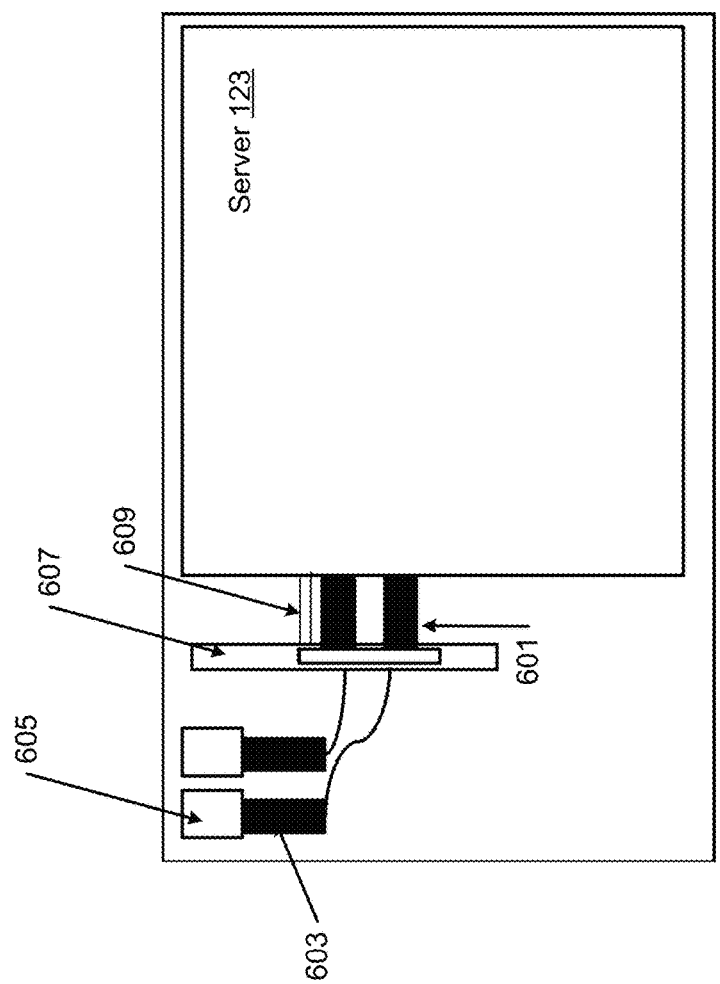
FIG. 6 shows a plain view of the rack level implementation according to an embodiment of the application.

FIG. 6 shows a plain view of the rack level implementation 600 according to an embodiment of the application. For example, FIG. 6 shows a plan view of the solution in a rack 605, and it can be seen that the adapting 607 system enable a fluid blind mating connection 601, 603 as well as a fluid self-regulation and auto-cutoff feature. For example, 603 is a rack manifold built in connector.

In an embodiment, the electromagnet is connected to an electrical circuit coupled with a direct current (DC) voltage source 609. In an embodiment, the server connector module having the server fluid connector 601 is attached onto a rear side of the server chassis 611 within the server chassis.

Figure 7:
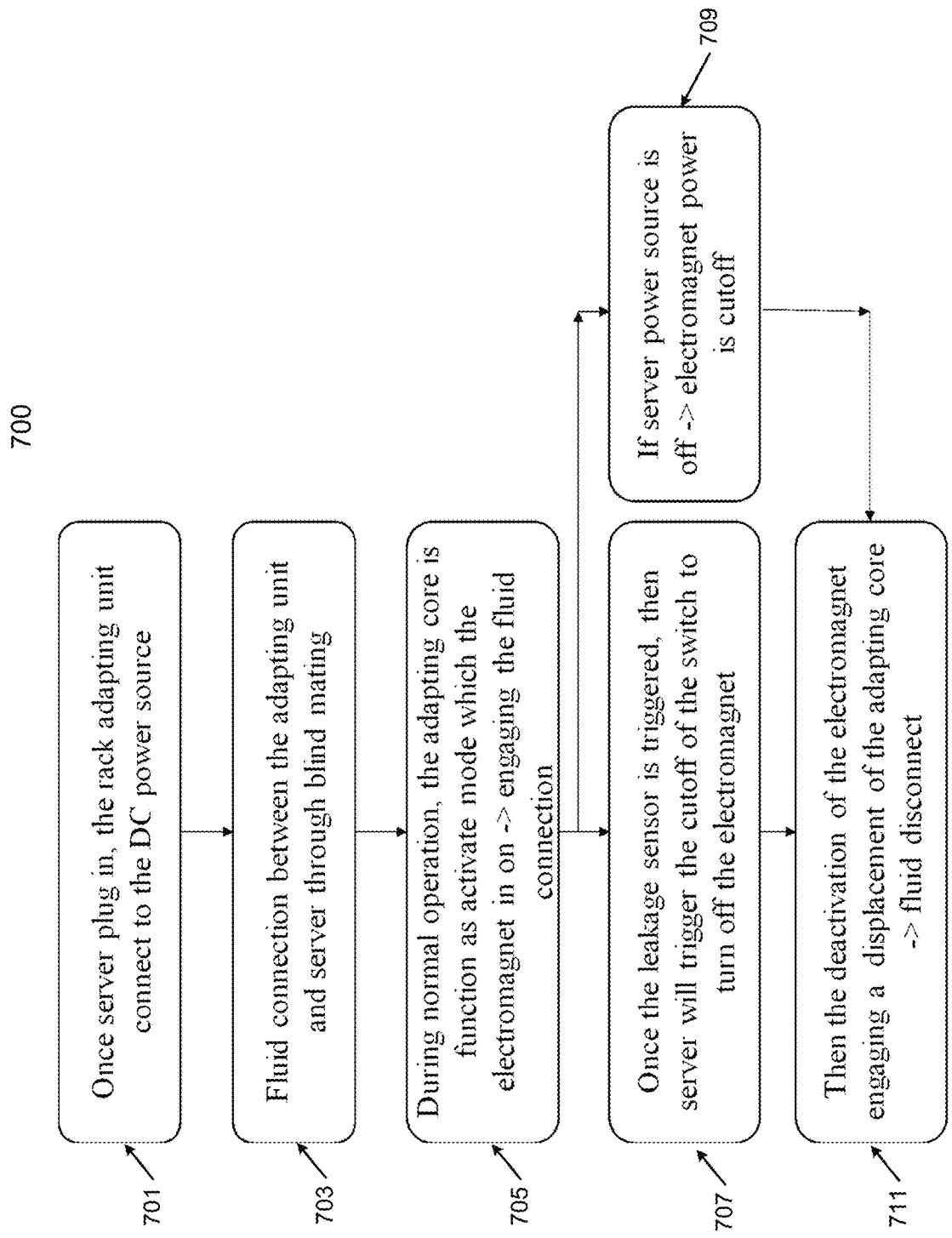
FIG. 7 shows a flow chart of the system operation design according to an embodiment of the application.

FIG. 7 shows a flow chart 700 of the system operation design according to an embodiment of the application. For example, FIG. 7 shows the system operating flowchart 700 with the solution proposed in the current disclosure, including the normal operating and fluid shutdown features.

In an embodiment, at operation 701, once server 123 is plugged in, the rack adapting unit will be connected to the DC power source 121. In an embodiment, at operation 703, there will be a fluid connection between the adapting unit 101 and the server 123 through blind mating 107. In an embodiment, at operation 705, during normal operation, the adapting core 101 functions at its active mode where the electromagnet 115 in on, while also: engaging the fluid connection. In an embodiment, at operation 707, once the leakage sensor 119 is triggered, server 123 will trigger the cut off of the switch 117 to turn off the electromagnet 115. In another embodiment, at operation 709, if server power source 119 is off, the electromagnet power is cut off. In an embodiment, after operation 707 or 709, at operation 711, the deactivation of the electromagnet 115 engages with the displacement of the adapting core 101 so that the fluid disconnects.

Figure 8:
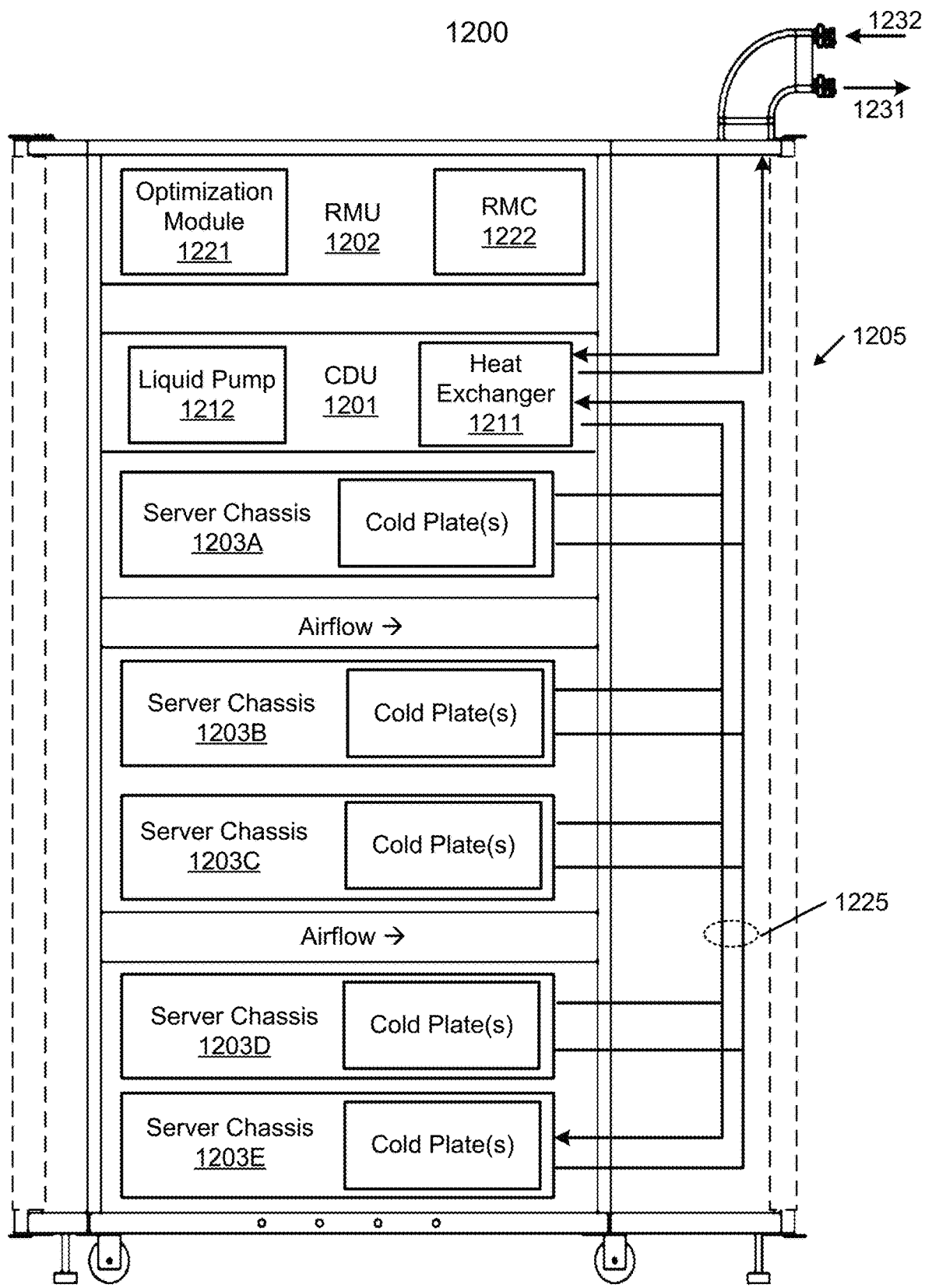
FIG. 8 is a block diagram illustrating an example of an electronic rack according to one embodiment.

FIG. 8 is block diagram illustrating an electronic rack according to one embodiment. Electronic rack 1200 may represent any of the electronic racks as described throughout this application. According to one embodiment, electronic rack 1200 includes, but is not limited to, coolant distribution unit (CDU) 1201, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Note that although there are five server chassis 1203A-1203E shown here, more or fewer server chassis may be maintained within electronic rack 1200. Also note that the particular positions of CDU 1201, RMU 1202, and/or server chassis 1203 are shown for the purpose of illustration only; other arrangements or configurations of CDU 1201, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the back-ends of server chassis 1203 or on the electronic rack to generate airflows flowing from frontend 1204, traveling through the air space of the server chassis 1203, and existing at backend 1205 of electronic rack 1200.

In one embodiment, CDU 1201 mainly includes heat exchanger 1211, liquid pump 1212, and a pump controller (not shown), and some other components such as a liquid reservoir, a power supply, monitoring sensors and so on. Heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to liquid manifold 1225 (also referred to as a rack manifold) to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to CDU 1201. Note that CDUs 1201 can be any kind of CDUs commercially available or customized ones. Thus, the details of CDUs 1201 will not be described herein.

Each of server chassis 1203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 1203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 1200 further includes optional RMU 1202 configured to provide and manage power supplied to servers 1203, and CDU 1201. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 1200.

In one embodiment, RMU 1202 includes optimization module 1221 and rack management controller (RMC) 1222. RMC 1222 may include a monitor to monitor operating status of various components within electronic rack 1200, such as, for example, computing nodes 1203, CDU 1201, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by the fan modules and liquid pump 1212, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for liquid pump 1212, such that the total power consumption of liquid pump 1212 and the fan modules reaches minimum, while the operating data associated with liquid pump 1212 and cooling fans of the fan modules are within their respective designed specifications. Once the optimal pump speed and optimal fan speeds have been determined, RMC 1222 configures liquid pump 1212 and cooling fans of the fan modules based on the optimal pump speeds and fan speeds.

As an example, based on the optimal pump speed, RMC 1222 communicates with a pump controller of CDU 1201 to control the speed of liquid pump 1212, which in turn controls a liquid flow rate of cooling liquid supplied to the liquid manifold 1225 to be distributed to at least some of server chassis 1203. Similarly, based on the optimal fan speeds, RMC 1222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown is described for the purpose of illustration only; other configurations or arrangements may also be applicable. For example, CDU 1201 may be an optional unit. The cold plates of server chassis 1203 may be coupled to a rack manifold, which may be directly coupled to room manifolds 1231-1232 without using a CDU. Although not shown, a power supply unit may be disposed within electronic rack 1200. The power supply unit may be implemented as a standard chassis identical or similar to a server chassis, where the power supply chassis can be inserted into any of the standard shelves, replacing any of server chassis 1203. In addition, the power supply chassis may further include a battery backup unit (BBU) to provide battery power to server chassis 1203 when the main power is unavailable. The BBU may include one or more battery packages and each battery package include one or more battery cells, as well as the necessary charging and discharging circuits for charging and discharging the battery cells.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An adapting core device, comprising:
   a main board including a fluid channel assembled by a manual mating connector and a blind mating connector, wherein the manual mating connector is connected to a rack connector of a rack manifold of an electronic rack coupled to an external cooling fluid source to receive and to return cooling fluid from and to the external cooling fluid source, wherein the blind mating connector is capable of being engaged with or disengaged from a server fluid connector of a server chassis, wherein the server fluid connector is configured to supply cooling fluid to one or more cooling devices attached to one or more electronic devices contained within the server chassis for providing liquid cooling, wherein the server chassis comprises a leaking sensor configured to detect leakage of the cooling fluid within the server chassis;
   an electromagnet device attached to a server side of the main board, wherein the electromagnet device is coupled to a server connector module and the leaking sensor, the electromagnet device comprising:
   an electromagnet, and
   a controller coupled to the electromagnet, in response to a leakage signal received from the leaking sensor indicating that a fluid leakage occurs, to modify a magnetic field associated with the electromagnet, which causes the blind mating connector to disengage from the server fluid connector.

2. The adapting core device of claim 1, wherein a spring structure is attached to a rack side of the main board to provide an opposite force to the magnetic field.

3. The adapting core device of claim 1, wherein the manual mating connector is connected to the rack connector of a rack manifold of the electronic rack through a hose.

4. The adapting core device of claim 1, wherein the server connector module having the server fluid connector is attached onto a rear side of the server chassis within the server chassis.

5. The adapting core device of claim 1, wherein the electromagnet is connected to an electrical circuit coupled with a direct current (DC) voltage source.

6. The adapting core device of claim 5, wherein the controller is coupled to a switch on the electrical circuit to provide power or cut off the power to the electromagnet in response to the leakage signal received from the leaking sensor.

7. The adapting core device of claim 1, wherein the adapting core device is pushed away from the server chassis when the magnetic field associated with the electromagnet is modified to lose magnetism, which causes the blind mating connector to disengage from the server fluid connector.

8. The adapting core device of claim 7, wherein when the adapting core device is pushed away from the server chassis, the server chassis and the rack manifold remain without moving.

9. The adapting core device of claim 8, wherein the adapting core device is pushed toward a connection location when the magnetic field associated with the electromagnet is modified to have magnetism.

10. An electronic rack, comprising:
    a rack manifold coupled to an external cooling fluid source to receive and to return cooling fluid from and to the external cooling fluid source, wherein the rack manifold comprises a plurality of connectors; and a plurality of adapting core devices arranged in a stack, wherein each adapting core device comprises:

a main board including a fluid channel assembled by a manual mating connector and a blind mating connector, wherein the manual mating connector is connected to a rack connector of the rack manifold of the electronic rack coupled to an external cooling fluid source to receive and to return cooling fluid from and to the external cooling fluid source, wherein the blind mating connector is capable of being engaged with or disengaged from a server fluid connector of a server chassis, wherein the server fluid connector is configured to supply cooling fluid to one or more cooling devices attached to one or more electronic devices contained within the server chassis for providing liquid cooling, wherein the server chassis comprises a leaking sensor configured to detect leakage of the cooling fluid within the server chassis;

an electromagnet device attached to a server side of the main board, wherein electromagnet device is coupled to a server connector module and the leaking sensor, the electromagnet device comprising:

an electromagnet, and a controller coupled to the electromagnet, in response to a leakage signal received from the leaking sensor indicating that a fluid leakage occurs, to modify a magnetic field associated with the electromagnet, which causes the blind mating connector to disengage from the server fluid connector.

11. The electronic rack of claim 10, wherein a spring structure is attached to a rack side of the main board.

12. The electronic rack of claim 10, wherein the manual mating connector is connected to the rack connector of a rack manifold of the electronic rack through a hose.

13. The electronic rack of claim 10, wherein the server connector module having the server fluid connector is attached onto a rear side of the server chassis within the server chassis.

14. The electronic rack of claim 10, wherein the electromagnet is connected to an electrical circuit coupled with a direct current (DC) voltage source.

15. The electronic rack of claim 14, wherein the controller is coupled to a switch on the electrical circuit to provide power or cut off the power to the electromagnet in response to the leakage signal received from the leaking sensor.

16. The electronic rack of claim 10, wherein the adapting core device is pushed away from the server chassis when the magnetic field associated with the electromagnet is modified to lose magnetism, which causes the blind mating connector to disengage from the server fluid connector.

17. The electronic rack of claim 10, wherein when the adapting core device is pushed away from the server chassis, the server chassis and the rack manifold remain without moving.

18. A server liquid cooling fluid cutoff system, comprising:

a plurality of server chassis arranged in a stack;

a rack manifold coupled to an external cooling fluid source to receive and to return cooling fluid from and to the external cooling fluid source, wherein the rack manifold comprises a plurality of connectors; and a plurality of adapting core devices arranged in a stack, wherein each adapting core device comprises:

a main board including a fluid channel assembled by a manual mating connector and a blind mating connector, wherein the manual mating connector is connected to a rack connector of a rack manifold of an electronic rack coupled to an external cooling fluid source to receive and to return cooling fluid from and to the external cooling fluid source, wherein the blind mating connector is capable of being engaged with or disengaged from a server fluid connector of a server chassis, wherein the server fluid connector is configured to supply cooling fluid to one or more cooling devices attached to one or more electronic devices contained within the server chassis for providing liquid cooling, wherein the server chassis comprises a leaking sensor configured to detect leakage of the cooling fluid within the server chassis;

an electromagnet device attached to a server side of the main board, wherein the electromagnet device is coupled to a server connector module and the leaking sensor, the electromagnet device comprising:

an electromagnet, and a controller coupled to the electromagnet, in response to a leakage signal received from the leaking sensor indicating that a fluid leakage occurs, to modify a magnetic field associated with the electromagnet, which causes the blind mating connector to disengage from the server fluid connector.

19. The server liquid cooling fluid cutoff system of claim 18, wherein the manual mating connector is connected to the rack connector of a rack manifold of the electronic rack through a hose.

20. The server liquid cooling fluid cutoff system of claim 18, wherein the electromagnet is connected to an electrical circuit coupled with a direct current (DC) voltage source.

* * * * *